United States Patent
Joergensen et al.

(10) Patent No.: US 7,886,553 B2
(45) Date of Patent: Feb. 15, 2011

(54) METHOD AND A CONTROL UNIT FOR CONTROLLING A POWER LEVEL

(75) Inventors: Henrik Joergensen, Graasten (DK); Rune Thomsen, Loegumkloster (DK)

(73) Assignee: Danfoss Compressors GmbH, Flensburg (DE)

( * ) Notice: Subject to any disclaimer, the term of this patent is extended or adjusted under 35 U.S.C. 154(b) by 1086 days.

(21) Appl. No.: 11/527,933

(22) Filed: Sep. 27, 2006

(65) Prior Publication Data

US 2007/0070771 A1     Mar. 29, 2007

(30) Foreign Application Priority Data

Sep. 29, 2005    (DK) ................. 2005 01359

(51) Int. Cl.
*F25B 49/00* (2006.01)
*G05F 5/00* (2006.01)

(52) U.S. Cl. ............... 62/230; 700/298; 323/299; 180/65.1

(58) Field of Classification Search .......... 62/228.4, 62/230; 700/292, 297, 298; 323/299; 180/95.1, 180/95.16

See application file for complete search history.

(56) References Cited

U.S. PATENT DOCUMENTS

| 6,240,737 | B1 | 6/2001 | Albiez ............... 62/228.5 |
| 6,253,563 | B1 | 7/2001 | Ewert et al. ............ 62/235.1 |
| 6,453,693 | B1 | 9/2002 | Ewert et al. ............ 62/236 |
| 6,469,487 | B2 | 10/2002 | Ewert et al. ............ 323/906 |
| 7,353,084 | B2 * | 4/2008 | Schaper et al. ............ 700/287 |
| 2002/0020181 | A1 | 2/2002 | Ewert et al. ............ 62/228.4 |
| 2002/0023450 | A1 | 2/2002 | Ewert et al. ............ 62/228.4 |
| 2002/0105443 | A1 | 8/2002 | Flick ............ 340/988 |

FOREIGN PATENT DOCUMENTS

| EP | 1 569 219 A2 | 2/2005 |
| JP | 5223397 | 8/1993 |
| JP | 6117678 | 4/1994 |

* cited by examiner

*Primary Examiner*—Marc E Norman
(74) *Attorney, Agent, or Firm*—McCormick, Paulding & Huber LLP

(57) ABSTRACT

A method and a control unit for controlling a power level being drawn from a power source (26). Based on a determined rate of change of a measured voltage (1) an estimated remaining runtime is calculated. The estimated remaining runtime represents a time where specific run criteria will no longer be fulfilled if the present power level is maintained. The estimated remaining runtime is compared to a threshold value, and in case the estimated remaining runtime is shorter than the threshold value, the power drawn from the power source (26) is decreased. Thereby the runtime for the power source (26) is maximised. This is particularly useful if the power source is a limited power source, such as a battery (26), e.g. for running a compressor (27) for a movable refrigeration system (24). The invention is suitable for automotive applications.

12 Claims, 3 Drawing Sheets

METHOD AND A CONTROL UNIT FOR CONTROLLING A POWER LEVEL

CROSS REFERENCE TO RELATED APPLICATIONS

Applicant hereby claims foreign priority benefits under U.S.C. §119 from Danish Patent Application No. PA 2005 01359 filed on Sep. 29, 2005 the contents of which are incorporated by reference herein.

FIELD OF THE INVENTION

The present invention relates to a method and a control unit for controlling a power level being drawn from a power source. More particularly, the present invention relates to a method and a control unit which ensures that the power source is capable of supplying power for as long a time as possible. The present invention is particularly useful when the power source is a limited power source, such as a battery. In a preferred embodiment the method and the control unit are used for controlling a compressor. Thus, the present invention is particularly useful for battery driven, e.g. mobile, refrigeration systems.

BACKGROUND OF THE INVENTION

When a limited power source, such as a battery, is used for driving electrical devices, such as compressors, it sometimes occurs that a required power need will result in the power source draining relatively quickly. If the power source should also be used for other purposes, such as starting a vehicle at a later time, this is highly undesirable. Because the power level required in order to start a vehicle will in most cases be higher than the power level required to run a compressor for a refrigeration system, this may result in the power level of the power source dropping below the level required for starting the vehicle, but the power level will still be sufficient to run the compressor, and the compressor will therefore continue to run. As a consequence, it will not be possible to start the vehicle when this is desired at a later time.

One possible solution to this is to simply let the compressor run as normal until the power level of the power source is slightly above a lower power level limit required in order to start the vehicle. However, this may result in the compressor being stopped a relatively long time before the vehicle is restarted, and a consequence may be that insufficient refrigeration may be provided to a refrigerated volume during the time elapsing from stopping the compressor to starting the vehicle, and this may lead to a too high temperature in the refrigerated volume. This is highly undesirable.

It is therefore desirable to be able to control the power level of the power source in such a way that a sufficient power level is available for various purposes of the power source when this is desired.

One way of obtaining this is described in U.S. Pat. No. 6,469,487, disclosing a solar powered vapour compression refrigeration system. The refrigeration system comprises an insulated enclosure and a thermal reservoir. A photovoltaic panel converts sunlight into DC (direct current) electrical power. The DC electrical power drives a compressor that circulates refrigerant through a vapour compression refrigeration loop to extract heat from the insulated enclosure and includes a phase change material. As heat is extracted from the insulated enclosure, the phase change material is frozen, and thereafter is able to act as a heat sink to maintain the temperature of the insulated enclosure in the absence of sunlight.

Furthermore, a controller monitors the rate of change of a smoothed power voltage to determine if the compressor is operating below or above the available power maximum, and adjusts the compressor speed accordingly. In this manner, the compressor operation is adjusted to convert substantially all available solar power into stored thermal energy.

The method and apparatus described in U.S. Pat. No. 6,469,487 does not, however, ensure that a sufficient power level will be available from the power source for other purposes than refrigeration at times where the power source is limited, i.e. no sunlight is available.

SUMMARY OF THE INVENTION

It is, thus, an object of the invention to provide a method and a control unit for controlling a power level being drawn from a power source in such a way that a sufficient power level is available for each of the purposes which the power source is used for.

It is a further object of the invention to provide a method and a control unit for controlling a power level being drawn from a power source in which the time interval during which the power source is capable of supplying at least a desired minimum power level is maximised to the greatest extent possible.

It is an even further object of the invention to provide a refrigeration system in which the power available from a power source is used in an optimum manner.

According to a first aspect of the invention the above and other objects are fulfilled by providing a method for controlling a power level being drawn from a power source, the method comprising the steps of:

measuring a voltage supplied from the power source, determining a rate of change of the measured voltage, based on the determined rate of change, calculating an estimated remaining runtime if the present power level is maintained, where specific run criteria will no longer be fulfilled when the estimated remaining runtime has elapsed, comparing the estimated remaining runtime to a first predefined threshold value, and decreasing the power drawn from the power source if the estimated remaining runtime is shorter than the first predefined threshold value.

The voltage supplied from the power source may be an output voltage measured across output terminals of the power source. Alternatively, the voltage may be an input voltage measured across input terminals of an apparatus having the voltage supplied thereto. The voltage is preferably measured using a digital filter in order to avoid errors in the measurement, e.g. due to noise. This may, e.g., be achieved by performing a number of measurements and calculate an average value based on the performed measurements.

The specific run criteria may comprise the supplied power level exceeding a specified level. The specified level may in this case be chosen as a minimum power level required in order to ensure that any desired purpose of the power source can be performed at any time. In a preferred embodiment the method is adapted to control a compressor of a mobile refrigeration system, e.g. a refrigeration system positioned onboard a vehicle. In this case the specified level may be chosen in such a way that if the vehicle is stopped and the refrigeration system therefore needs to be driven by a vehicle battery, sufficient power should at any time be available for running the compressor as well as starting the vehicle. Since the power level required to start the vehicle will in most cases be larger than the power level required to run the compressor, the power level required to start the vehicle may, in this example, be chosen as the specified level.

Alternatively, the specific run criteria may comprise any other suitable criteria necessary to allow the apparatus to run properly.

The first predefined threshold value preferably represents a time interval, running from the time of measurement of the supplied voltage, during which it is desired to fulfil the specific run criteria. Preferably, the first predefined threshold value is chosen in such a way that the power drawn from the power source can be reduced before the run criteria are no longer fulfilled, because it may otherwise be difficult to restart the apparatus at a later time.

Thus, according to the present invention, an estimated remaining runtime is calculated on the basis of a determined rate of change of the voltage supplied from the power source. This estimated remaining runtime represents an expected time interval during which specified run criteria will remain fulfilled if the present power level is maintained. Subsequently, the estimated remaining runtime is compared to a first predefined threshold value as defined above. On the basis of this it is determined whether or not the present power level is appropriate, taking into consideration that it is desirable to fulfil the specified run criteria for at least as long as defined by the first predefined threshold value. If the estimated remaining runtime is shorter than the first predefined threshold value, this is an indication that the specified run criteria will probably no longer be fulfilled at a point in time which is earlier than desired. Accordingly, the present power level is probably too high, and the power drawn from the power source is therefore decreased in order to prolong the time interval during which the specified run criteria will remain fulfilled.

Thereby it is ensured that the specified run criteria are fulfilled for a maximum possible time period, and the time during which the apparatus functions in an appropriate manner is thereby maximised. In the case that the power source is a limited power source, such as a battery, the maximum possible runtime for the power source is thereby maximised.

The step of determining a rate of change of the measured voltage may comprise the step of determining the length of a time interval during which the measured voltage changes a predefined amount. A value representing a rate of change of the measured voltage during the determined time interval may then be easily calculated by dividing the amount which the voltage has changed by the length of the determined time interval. In most cases the rate of change of the measured voltage is negative, i.e. the voltage level supplied by the power source is decreasing. In this case the rate of change of the measured voltage may preferably be determined in the following manner. Initially the supplied voltage is measured, and a timer is simultaneously started. The voltage is then monitored while the timer is running, and when the voltage level has decreased by a predefined amount, e.g. 0.5 V or another appropriate value, the timer is stopped. An approximate rate of change of the measured voltage can then be calculated by dividing −0.5 V by the reading of the timer. Alternatively, the reading of the timer may be used directly as a measure for the rate of change of the measured voltage, since the predefined amount which the voltage has changed is fixed, or at least known.

The step of calculating an estimated remaining runtime may be performed on the basis of the determined length of the time interval and the measured voltage. In one embodiment, in which the voltage level is decreasing, this may be done in the following manner. Knowing the predefined amount which the voltage has decreased, the last measured voltage level and a minimum voltage below which the voltage level should not be allowed to decrease, it is possible to calculate how many more 'voltage steps' of the predefined amount the voltage level should be allowed to decrease. Assuming that the time it takes the voltage level to decrease by the predefined amount is at least substantially the same each time, an estimate for the remaining runtime can be obtained by multiplying the determined length of the time interval by the number of allowed 'voltage steps'. Since it must be expected that the decrease in voltage is not a linear function of time, the described method will not result in an accurate value for the remaining runtime. However, the obtained value will provide an estimate for the remaining runtime, and this estimate can be compared to an appropriately chosen first predefined threshold value. The non-linear nature of the decrease in voltage may be taken into account when the first predefined threshold value is chosen.

The method may further comprise the step of connecting the power source to a compressor in such a way that the measured voltage is supplied to the compressor, in which case decreasing the power drawn from the power source preferably results in a reduced rotational speed of the compressor. According to this embodiment, the method is used for controlling the rotational speed of a compressor, preferably a compressor of a refrigeration system. The rotational speed of the compressor is preferably controlled in such a manner that power will be available from the power source for as long a time as possible and at a level sufficient to ensure proper function of each of the purposes of the power source.

The method may further comprise the steps of:
  comparing the estimated remaining runtime to a second predefined threshold value, and
  increasing the power drawn from the power source if the estimated remaining runtime is longer than the second predefined threshold value.

This is particularly useful when the power level being drawn from the power source has previously been decreased, as described above, from a maximum power level. In this case the estimated remaining runtime may be monitored in order to determine whether or not it will be safe to increase the power drawn from the power source again.

The second predefined threshold value may be the same as the first predefined threshold value. However, in most cases the first predefined threshold value and the second predefined threshold value will differ, and the second predefined threshold value is preferably larger than the first predefined threshold value. Thereby it may be avoided that the power level (and possibly a rotational speed of a compressor) is repeatedly switched between a high and a low level at small time intervals because the estimated remaining runtime oscillates about a single common threshold value. By choosing the second predefined threshold value to be larger than the first predefined threshold value, once the power level has been decreased, the estimated remaining runtime must increase by a certain substantial amount before the power level is once again increased. Thereby it is also ensured that the estimated remaining runtime is actually increasing before the power level drawn from the power source is increased following a decrease in the power level drawn.

According to a second aspect of the invention the above and other objects are fulfilled by providing a control unit for controlling a power level being drawn from a power source, the control unit comprising:
  means for measuring a voltage supplied from the power source,
  means for determining a rate of change of the measured voltage, means for calculating, based on the determined rate of change, an estimated remaining runtime if the present power level is maintained, where specific run criteria will no longer be fulfilled when the estimated remaining runtime has elapsed, means for comparing the estimated remaining runtime to a first predefined threshold value and for generating a corresponding output, and means for controlling the power drawn from the power source on the basis of the generated output.

It should be noted that a person skilled in the art would readily recognise that any feature described in connection with the first aspect of the invention may also be combined with the second aspect of the invention, and vice versa.

The means for measuring the voltage supplied from the power source preferably is or comprises a voltmeter.

The means for calculating an estimated remaining runtime and/or the means for comparing the estimated remaining runtime to a first predefined threshold value preferably are or form part of a microcontroller.

The means for determining a rate of change of the measured voltage may comprise a timer adapted to measure the length of a time interval during which the measured voltage changes a predefined amount. This has already been described above.

The control unit may be adapted to control a compressor, in which case controlling the power drawn from the power source results in controlling a rotational speed of the compressor. This has also been described above.

The means for controlling the power drawn from the power source may comprise means for decreasing the power drawn from the power source if the estimated remaining runtime is shorter than the first predefined threshold value.

The control unit may further comprise means for comparing the estimated remaining runtime to a second predefined threshold value, and the means for controlling the power drawn from the power source may comprise means for increasing the power drawn from the power source if the estimated remaining runtime is longer than the second predefined threshold value.

The control unit according to the second aspect of the invention may advantageously form part of a refrigeration system, which further comprises a compressor, an evaporator and a power source. The power source may advantageously comprise a battery and/or another limited power source, such as a solar panel. The refrigeration system is, in this case, suitable for automotive applications, i.e. for applications where the refrigeration system is positioned in a vehicle, e.g. a land based vehicle, such as a car, a camper, a van or a truck, a water based vehicle, such as a boat, or an airborne vehicle, such as an aircraft.

BRIEF DESCRIPTION OF THE DRAWINGS

The invention will now be further described with reference to the accompanying drawings in which.

DETAILED DESCRIPTION OF THE INVENTION

Figure 1:
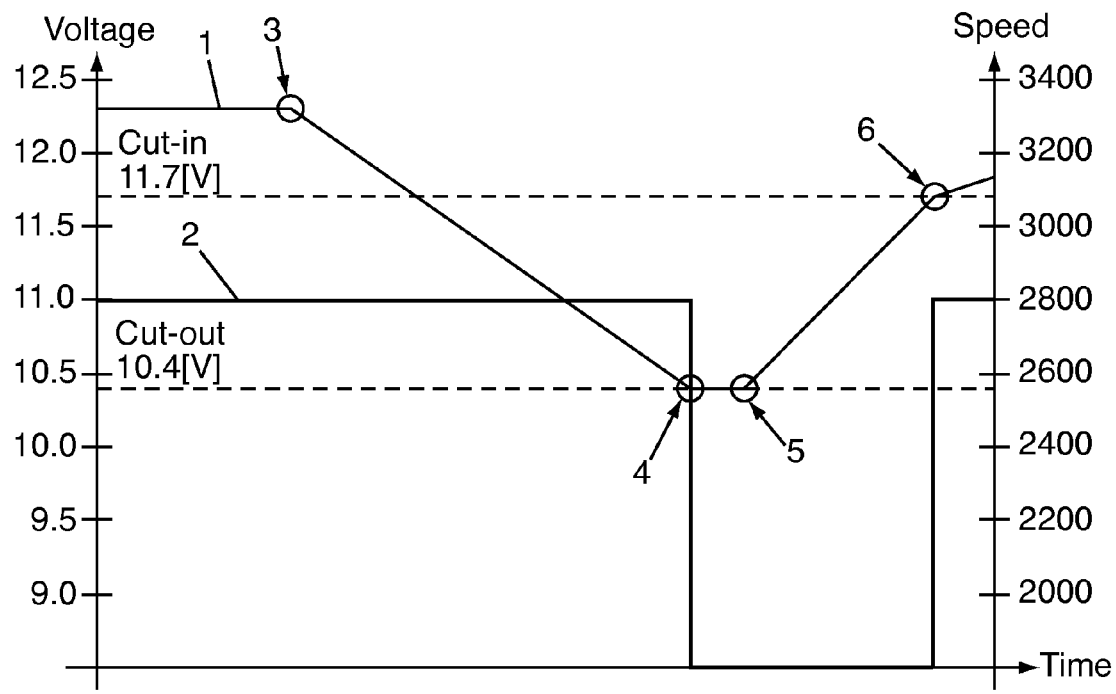
FIG. 1 is a plot of measured voltage and rotational speed of a compressor in a prior art refrigeration system, as a function of time.

FIG. 1 is a plot of measured voltage 1 supplied from a power source, and rotational speed 2 of a compressor as a function of time. Initially, the voltage 1 as well as the rotational speed 2 is at a relatively high level. At time 3 the voltage 1 starts decreasing because the power source, which in the illustrated case is a limited power source, such as a battery, starts discharging. However, the rotational speed 2 is maintained at the initial level. The voltage 1 continues to decrease until time 4 where a lower voltage limit (the so-called cut-out voltage) is reached. In the example illustrated in FIG. 1 the cut-out voltage is 10.4 V. The voltage 1 should not be allowed to decrease below the cut-out voltage level, and therefore the compressor is stopped at time 4. This naturally causes the rotational speed 2 of the compressor to decrease to zero.

The voltage 1 subsequently remains at the cut-out level for a while until it, at time 5 starts increasing as a consequence of the stopped compressor, i.e. the power source is being recharged. The compressor remains stopped until, at time 6, the voltage has reached another voltage limit (the so-called cut-in voltage). In the example illustrated in FIG. 1, the cut-in voltage is 11.7 V. It is assumed that it is once again safe to turn on the compressor when the voltage 1 has increased to a level above the cut-in voltage, and, as a consequence, the compressor is restarted at time 6, thereby causing the rotational speed 2 to increase to the initial level.

Figure 2:
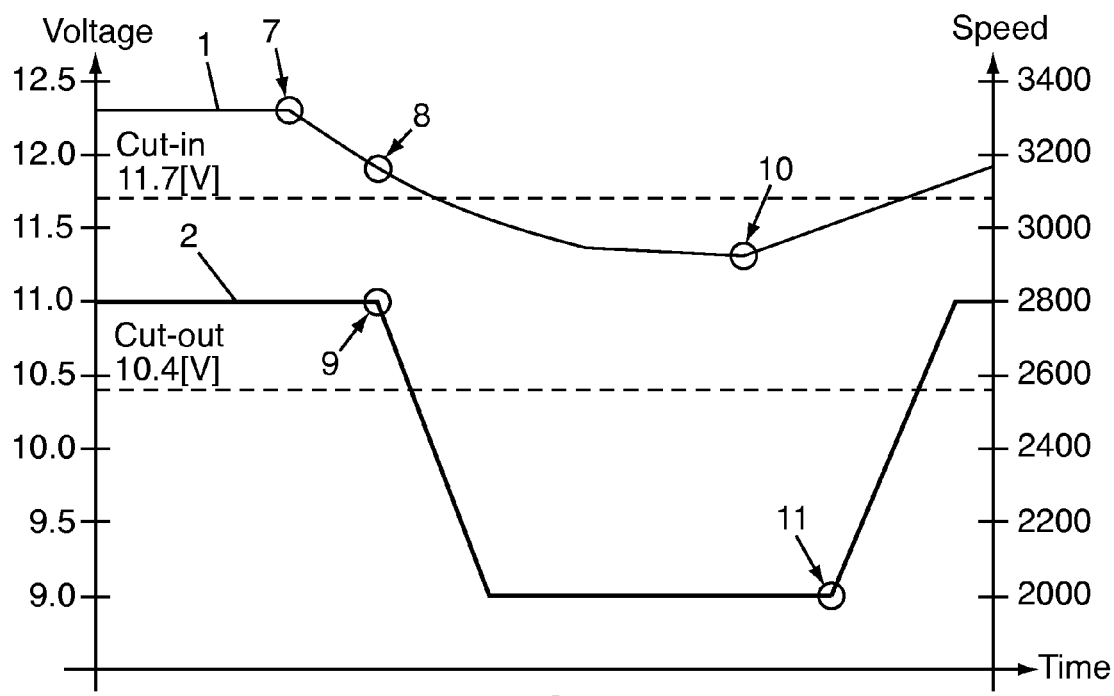
FIG. 2 is a plot of measured voltage and rotational speed of a compressor in a refrigeration system according to an embodiment of the invention, as a function of time.

FIG. 2 is a plot of measured voltage 1 supplied from a power source, and rotational speed 2 of a compressor as a function of time. As described in connection with FIG. 1, the voltage 1 as well as the rotational speed 2 is initially at a relatively high level. At time 7 the voltage 1 starts to decrease, e.g. because the power source starts discharging as described above. At time 8 is has been determined, using the method according to an embodiment of the invention, that the estimated remaining runtime (if the present power level is maintained) is shorter than a first predefined threshold value. As a consequence, a decrease of the rotational speed 2 is initiated at time 9, which is preferably simultaneous, or almost simultaneous, with time 8. The rotational speed 2 is decreased to a lower level, but the compressor is not stopped. Thereby refrigeration is still provided. Decreasing the rotational speed 2 causes the rate of change of the voltage 1 to become nominally smaller, and this in turn causes the estimated remaining runtime to increase.

At time 10 the voltage 1 starts increasing again, i.e. the power source is recharging. At time 11 it has been determined, using the method according to an embodiment of the invention, that the estimated remaining runtime has increased above a second predefined threshold level, and the rotational speed 2 is accordingly allowed to increase to the initial level.

Thus, according to the embodiment of the invention illustrated in FIG. 2, the runtime of the system, i.e. the time in which the system can run and supply sufficient power to each of the purposes of the power source, is maximised. At the same time, the compressor is not stopped at any time, and refrigeration may therefore be continuously provided.

Figure 3:
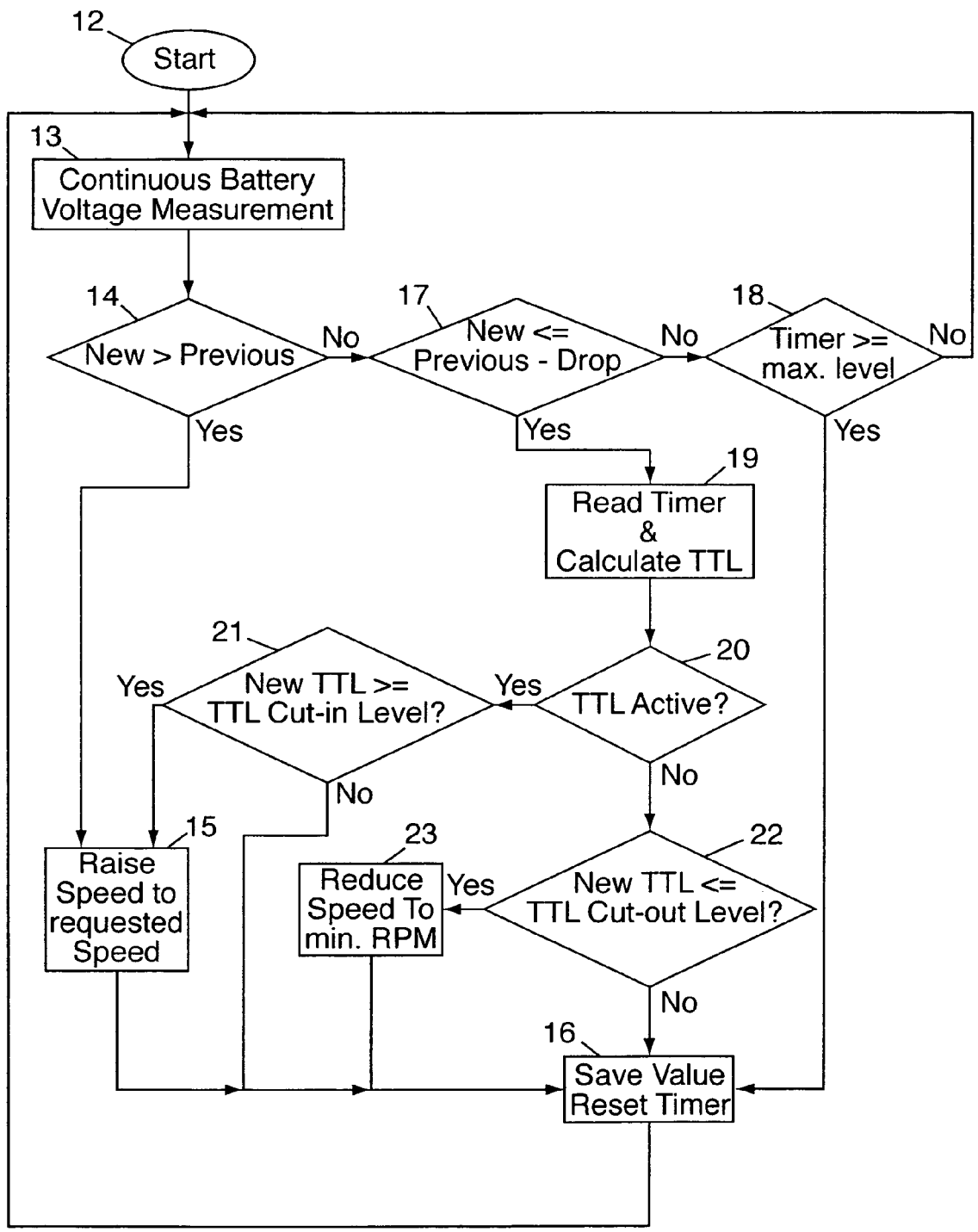
FIG. 3 is a flowchart illustrating a method according to an embodiment of the invention.

FIG. 3 is a flowchart illustrating a method according to an embodiment of the invention. The process is started at step 12. At step 13 the voltage supplied by the power source, which in this case is a battery, is measured. At step 14 the measured voltage is compared to a previously measured voltage. If the new voltage value is larger than the one which was measured previously, it is determined that the voltage level is not decreasing, and the rotational speed is increased to a requested speed at step 15. Subsequently, the new value is saved at step 16, the timer is reset, and the process is returned to step 13.

If, on the other hand, the comparison at step 14 reveals that the new voltage value is smaller than or equal to the previously measured voltage value, it is determined that the voltage level is decreasing, and the process continues to step 17 for further investigation. At step 17 it is investigated whether or not the voltage value has decreased by a predefined amount ('Drop') since the previous measurement. If this is not the case, i.e. if the new voltage value is larger than the previously measured value with the 'Drop' value subtracted, the process continues to step 18, where it is investigated whether or not the timer has exceeded a maximum level. If this is the case, the process continues to step 16, and if this is not the case, the process is returned to step 13.

If the comparison of step 17 reveals that the voltage has decreased by the predefined amount, i.e. that the new voltage is smaller than or equal to the previously measured value with the 'Drop' value subtracted, the process continues to step 19. At step 19 the timer value is read and the estimated remaining runtime (Time-To-Live—TTL) is calculated on the basis of the timer value. This has been described above.

Subsequently the process continues to step 20 where it is investigated whether or not the TTL mode is active, i.e. whether or not the power level supplied by the power source has already been decreased in order to increase the runtime of the system. If this is the case, the process continues to step 21, where it is investigated whether or not the new TTL is larger than or equal to a threshold value, the TTL cut-in level. If this is the case, the rotational speed is increased to a requested speed at step 15, and the process subsequently continues to step 16.

If the investigation at step 21, on the other hand, reveals that the new TTL is smaller than the TTL cut-in level, the process continues directly to step 16 without increasing the rotational speed.

If, at step 20, it is revealed that the TTL mode is not active, the process continues to step 22, where the estimated remaining runtime, which was calculated at step 19, is compared to a predefined threshold value, the TTL cut-out level. If the estimated remaining runtime is smaller than or equal to the TTL cut-out level, the rotational speed is decreased to a minimum value at step 23. Subsequently, the process continues to step 16. If, on the other hand, the estimated remaining runtime is larger than the TTL cut-out level, the process continues directly to step 16 without decreasing the rotational speed.

Figure 4:
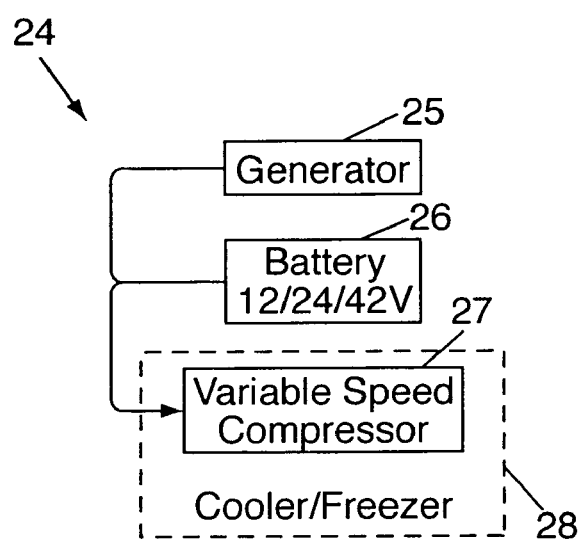
FIG. 4 is a schematic diagram illustrating a refrigeration system according to an embodiment of the invention.

FIG. 4 is a schematic diagram illustrating a refrigeration system 24 according to an embodiment of the invention. The refrigeration system 24 comprises a generator 25 connected to a battery 26 which is in turn connected to a variable speed compressor 27. Thus, the battery 26 supplies power to the variable speed compressor 27, and the generator 25 charges the battery 26.

The variable speed compressor 27 forms part of the refrigeration circuit of the refrigeration system 24. In order to illustrate this, the variable speed compressor 27 is shown positioned inside a cooler/freezer 28. It should be noted, however, that this does not mean that the variable speed compressor 27 should be positioned inside a refrigerated volume.

While the present invention has been illustrated and described with respect to a particular embodiment thereof, it should be appreciated by those of ordinary skill in the art that various modifications to this invention may be made without departing from the spirit and scope of the present invention.

What is claimed is:

1. A method for controlling a power level being drawn from a power source, the method comprising the steps of:
   measuring a voltage supplied from the power source,
   determining a rate of change of the measured voltage,
   based on the determined rate of change, calculating an estimated remaining runtime if the present power level is maintained, where specific run criteria will no longer be fulfilled when the estimated remaining runtime has elapsed,
   comparing the estimated remaining runtime to a first predefined threshold value, and
   decreasing the power drawn from the power source if the estimated remaining runtime is shorter than the first predefined threshold value.

2. The method according to claim 1, wherein the step of determining a rate of change of the measured voltage comprises the step of determining the length of a time interval during which the measured voltage changes a predefined amount.

3. The method according to claim 2, wherein the step of calculating an estimated remaining runtime is performed on the basis of the determined length of the time interval and the measured voltage.

4. The method according to claim 1, further comprising the step of connecting the power source to a compressor in such a way that the measured voltage is supplied to the compressor, and wherein decreasing the power drawn from the power source results in a reduced rotational speed of the compressor.

5. The method according to claim 1, further comprising the steps of:
   comparing the estimated remaining runtime to a second predefined threshold value, and
   increasing the power drawn from the power source if the estimated remaining runtime is longer than the second predefined threshold value.

6. A control unit for controlling a power level being drawn from a power source, the control unit comprising:
   means for measuring a voltage supplied from the power source,
   means for determining a rate of change of the measured voltage,
   means for calculating, based on the determined rate of change, an estimated remaining runtime if the present power level is maintained, where specific run criteria will no longer be fulfilled when the estimated remaining runtime has elapsed,
   means for comparing the estimated remaining runtime to a first predefined threshold value and for generating a corresponding output, and
   means for controlling the power drawn from the power source on the basis of the generated output.

7. The control unit according to claim 6, wherein the means for determining a rate of change of the measured voltage comprises a timer adapted to measure the length of a time interval during which the measured voltage changes a predefined amount.

8. The control unit according to claim 6, wherein the control unit is adapted to control a compressor, and wherein controlling the power drawn from the power source results in controlling a rotational speed of the compressor.

9. The control unit according to claim 6, wherein the means for controlling the power drawn from the power source comprises means for decreasing the power drawn from the power source if the estimated remaining runtime is shorter than the first predefined threshold value.

10. The control unit according to claim 6, further comprising means for comparing the estimated remaining runtime to a second predefined threshold value, wherein the means for controlling the power drawn from the power source comprises means for increasing the power drawn from the power source if the estimated remaining runtime is longer than the second predefined threshold value.

11. A refrigeration system comprising a compressor, an evaporator, a power source and a control unit according to claim 6.

12. The refrigeration system according to claim 11, wherein the power source comprises a battery.

* * * * *